United States Patent
Donofrio et al.

(10) Patent No.: US 8,216,867 B2
(45) Date of Patent: Jul. 10, 2012

(54) FRONT END SCRIBING OF LIGHT EMITTING DIODE (LED) WAFERS AND RESULTING DEVICES

(75) Inventors: Matthew Donofrio, Raleigh, NC (US); Winston T. Parker, Cary, NC (US); Michael John Bergmann, Chapel Hill, NC (US); Steven Scott Gilmore, Raleigh, NC (US); Jay Thomas Norman, Durham, NC (US); Kevin Shawne Schneider, Cary, NC (US)

(73) Assignee: Cree, Inc., Durham, NC (US)

( * ) Notice: Subject to any disclaimer, the term of this patent is extended or adjusted under 35 U.S.C. 154(b) by 190 days.

(21) Appl. No.: 12/482,165

(22) Filed: Jun. 10, 2009

(65) Prior Publication Data

US 2010/0314633 A1    Dec. 16, 2010

(51) Int. Cl.
    H01L 21/00    (2006.01)
(52) U.S. Cl. ... 438/33; 438/462; 438/463; 257/E21.347; 257/E21.599
(58) Field of Classification Search ............. 438/22, 438/33, 462, 463; 257/88, 103, E21.596, 257/E21.347, E21.599, E23.025
    See application file for complete search history.

(56) References Cited

U.S. PATENT DOCUMENTS

| | | | |
|---|---|---|---|
| 4,904,617 A | 2/1990 | Muschke | |
| 5,631,190 A | 5/1997 | Negley | |
| 6,489,524 B1 | 12/2002 | Shelton et al. | |
| 6,590,233 B2 * | 7/2003 | Sugawara | 257/90 |
| 6,953,705 B2 * | 10/2005 | Prakash | 438/99 |
| 6,992,026 B2 | 1/2006 | Fukuyo et al. | |
| 2005/0215000 A1 | 9/2005 | Negley | |
| 2008/0242056 A1 | 10/2008 | Sercel et al. | |
| 2008/0261341 A1 * | 10/2008 | Zimmerman et al. | 438/33 |
| 2009/0029499 A1 | 1/2009 | Nakahara | |
| 2009/0207872 A1 * | 8/2009 | Takei et al. | 372/44.01 |

FOREIGN PATENT DOCUMENTS

| | | |
|---|---|---|
| EP | 1 376 687 A2 | 1/2004 |
| WO | WO 2008/038945 A1 | 4/2008 |

OTHER PUBLICATIONS

Invitation to Pay Additional Fees and, Where Applicable, Protest Fee, PCT/US2010/036101, Date of mailing: Aug. 26, 2010, 6 pages.
Notification of Transmittal of the International Search Report and the Written Opinion of the International Searching Authority, or the Declaration; International Search Report; Written Opinion of the International Searching Authority corresponding to International Application No. PCT/US2010/036101; Date of mailing: Dec. 8, 2010; 19 pages.
International Preliminary Report on Patentability, PCT Application No. PCT/US2010/036101, Nov. 7, 2011.

* cited by examiner

*Primary Examiner* — Khiem D Nguyen
(74) *Attorney, Agent, or Firm* — Myers Bigel Sibley & Sajovec, P.A.

(57) ABSTRACT

A wafer of light emitting diodes (LEDs) is laser scribed to produce a laser scribing cut. Then, the wafer is cleaned, for example by wet etching, to reduce scribe damage. Then, electrical contact layers for the LEDs are formed on the wafer that has been cleaned. Alternatively, the scribing cut may be produced by multiple etches before contact formation. Related LEDs are also described.

16 Claims, 7 Drawing Sheets

FRONT END SCRIBING OF LIGHT EMITTING DIODE (LED) WAFERS AND RESULTING DEVICES

BACKGROUND OF THE INVENTION

This invention relates to methods of fabricating semiconductor light emitting devices and resulting structures, and more particularly to methods of fabricating semiconductor Light Emitting Diodes (LEDs) and resulting structures.

Semiconductor LEDs are widely known solid-state lighting elements that are capable of generating light upon application of voltage thereto. LEDs generally include a diode region including therein an n-type layer, p-type layer and a p-n junction. An anode contact ohmically contacts the p-type layer and a cathode contact ohmically contacts the n-type layer.

LEDs generally are fabricated in wafer form, wherein an epitaxial region, including the diode region, is epitaxially formed on a substrate, such as a sapphire, silicon, silicon carbide, gallium arsenide, gallium nitride, etc. growth substrate. The diode region may be fabricated, for example, from silicon carbide, gallium nitride, gallium phosphide, aluminum nitride and/or gallium arsenide-based materials, and/or from organic semiconductor-based materials.

After the epitaxial region is fabricated, contacts may be formed on the substrate and/or on the epitaxial region, to ohmically contact the p-type layer and the n-type layer. The contacts generally include one or more metal layers and may also include transparent conductive layers, such as indium tin oxide.

After contact fabrication, the wafer is diced or singulated into individual LEDs or individual groups of LEDs. Dicing or singulation generally is a two-step process. First, scribe lines are formed on the wafer. Then, the wafer is cleaved or broken along the scribe lines using a fracturing machine.

Scribing originally was performed by a diamond scribing tool. However, since many of the substrate wafers are extremely hard, the use of mechanical scribing tools may adversely impact the throughput, yield, reliability and/or performance of the LEDs. Accordingly, lasers have emerged as a scribing tool. Note, for example, U.S. Patent Application Publication 2008/0242056 to Sercel et al. entitled System and Method for Cutting Using a Variable Astigmatic Focal Beam Spot and U.S. Pat. No. 6,992,026 to Fukuyo et al., entitled Laser Processing Method and Laser Processing Apparatus. Also note, for example, U.S. Pat. No. 5,631,190 to Negley entitled Method for Producing High Efficiency Light-Emitting Diodes and Resulting Diode Structures and U.S. Patent Application Publication 2005/0215000 to Negley entitled Etching of Substrates of Light Emitting Devices.

SUMMARY OF THE INVENTION

LEDs are fabricated, according to various embodiments, by laser scribing a wafer that includes a substrate and an LED epitaxial region thereon, to produce a laser scribing cut. Then, the wafer that has been laser scribed is cleaned, for example by wet etching, to reduce scribe damage to the substrate by the laser scribing. Then, electrical contact layers for the LED are formed on the wafer that has been cleaned. Accordingly, scribe damage produced by the laser scribing can be reduced or eliminated by the cleaning. Moreover, by moving the laser scribing and cleaning to the front end of the fabrication process, after forming the LED epitaxial region but before forming the electrical contact layers, the cleaning need not adversely impact the performance and/or reliability of the completed LED.

In some embodiments, laser scribing comprises impinging a laser beam through the LED epitaxial region and partially into the substrate to produce the laser scribing cut, and the cleaning comprises wet etching the wafer through the LED epitaxial region that has been laser scribed and into the substrate that has been laser scribed. In other embodiments, laser scribing may be performed at least twice under different parameters to control the geometry of the laser scribing cut.

In some embodiments, the substrate generally is a crystalline substrate, and the laser scribing creates a laser scribing cut having an amorphous surface. The cleaning removes at least some of the amorphous surface to expose at least some of the crystalline substrate at the laser scribing cut. Accordingly, scribe damage caused by the laser may be at least partially cured. In other embodiments, the cleaning changes a geometry of the laser scribing cut. Thus, a desired sidewall geometry for the LED may be provided.

In some embodiments, cleaning is performed using a wet etching solution above room temperature. In some embodiments, a cleaning solution that comprises sulfuric acid and phosphoric acid is used at a temperature of about 275° C.

Moreover, in some embodiments, prior to performing the cleaning, at least some of the LED epitaxial region is masked to protect the LED epitaxial region. In some embodiments, this masking takes place prior to performing the laser scribing. In other embodiments, this masking takes place after performing the laser scribing, but before the cleaning.

After the cleaning has been performed, the substrate may be thinned or removed, and/or the LED epitaxial region may be attached to a carrier substrate. The wafer is also singulated to produce a plurality of LEDs. Accordingly, some embodiments can laser scribe a wafer that comprises an unthinned substrate and an LED epitaxial region thereon, to produce a laser scribing cut. The wafer that has been laser scribed is then cleaned to reduce the scribe damage to the unthinned substrate by laser scribing. Then, the unthinned substrate is thinned.

LEDs are fabricated, according to other embodiments, by etching an LED epitaxial region of a wafer that comprises a substrate and the LED epitaxial region thereon, to define in trench in the LED epitaxial region that exposes the substrate. A mask is formed on sidewalls of the trench while still exposing the substrate. The mask may also be formed on the LED epitaxial region outside the trench. Further etching is performed partially into the substrate that has been exposed, to produce a scribing cut in the substrate. Thus, a multiple etching process may take place.

In some embodiments, after further etching partially into the substrate, the mask is removed from the sidewalls, and electrical contacts are formed on the wafer. Thereafter, the wafer is singulated. Wafer thinning may also take place.

LEDs according to some embodiments include a crystalline substrate and an LED epitaxial region on the crystalline substrate, wherein a sidewall of the LED epitaxial region and a sidewall of the crystalline substrate adjacent thereto extend oblique to a face of the LED epitaxial region. Moreover, the oblique sidewall of the crystalline substrate has a crystalline surface. The oblique sidewalls and the crystalline surface may be produced by the combination of laser scribing and cleaning or by multiple etching as described above.

Moreover, the oblique sidewall of the crystalline substrate also may include texturing therein that extends along crystal planes of the crystalline substrate. This texturing along crystal planes may be obtained by the action of the cleaning, which may remove laser damage and may preferentially etch along crystal planes of the crystalline substrate.

DETAILED DESCRIPTION

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments are described herein in connection with operational flowcharts. It should be noted that in some alternate embodiments, the functions/acts noted in the blocks may occur out of the order noted in the flowcharts unless expressly stated to the contrary herein. For example, two blocks shown in succession may in fact be executed substantially concurrently or the blocks may sometimes be executed in the reverse order, depending upon the functionality/acts involved, unless expressly stated to the contrary herein. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Some embodiments now will be described generally with reference to gallium nitride (GaN)-based light emitting diodes on silicon carbide (SiC) or sapphire mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diodes on SiC or sapphire ($Al_2O_3$) mounting substrates and/or a Group III-nitride-based diode on gallium nitride, silicon carbide, aluminum nitride, sapphire, zinc oxide and/or other mounting substrates. Moreover, in other embodiments, a mounting substrate may not be present in the finished product. In some embodiments, the light emitting diodes may be gallium nitride-based LED devices manufactured and sold by Cree, Inc. of Durham, N.C.

Figure 1:
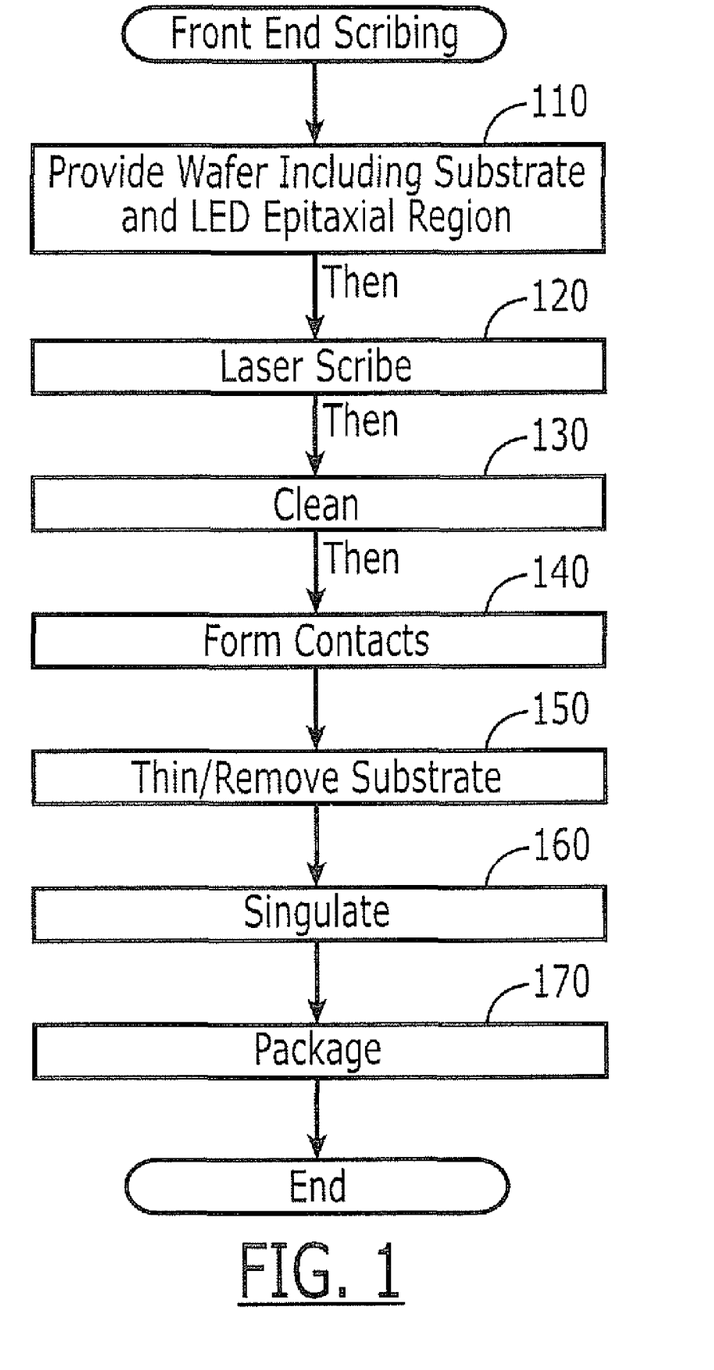
FIG. 1 is a flowchart of operations that may be used to fabricate an LED according to various embodiments.

FIG. 1 is a flowchart of operations that may be performed to provide front end scribing according to various embodiments. Referring to FIG. 1, at Block 110, a wafer is fabricated or otherwise provided. The wafer includes a substrate and an LED epitaxial region thereon. In some embodiments, the substrate comprises silicon carbide or sapphire, and the LED epitaxial region comprises gallium nitride-based materials. However, other configurations of substrates and LED epitaxial regions may be provided.

Then, referring to Block 120, the wafer is laser scribed to produce a laser scribing cut. In some embodiments, laser scribing may take place by impinging a laser beam through the LED epitaxial region and partially into the substrate. In other embodiments, laser scribing may take place by impinging a laser beam partially into the substrate from a face that is opposite the LED epitaxial region.

Laser scribing by impinging a laser beam through the LED epitaxial region and partially into the substrate, also referred to as "front side scribing", may be particularly advantageous in some embodiments. In particular, although front side scribing may cause higher radiant flux loss, it may be desirable to use front side scribing, because it can reduce or eliminate the risk of damage to the LED epitaxial region in the active area as a result of back side laser scribing (i.e., scribing through the back face of the substrate that is opposite the LED epitaxial region. Back side scribing may need to use more sophisticated optics/laser systems, to avoid having scattered laser radiation hit the LED active area, which may cause decomposition of the gallium nitride-based materials and to thereby cause delamination. In contrast, front side scribing may reduce or eliminate this undesirable effect.

The various laser parameters, such as power, duration, frequency, beam width and/or depth may be controlled to provide a desired laser scribing cut geometry, for example a desired depth and/or sidewall profile. Multiple passes of the laser may also be used under different parameters to produce a desired laser scribing cut geometry. The laser scribing produces a damaged surface of the laser scribing cut, in the form of an amorphous surface due to melting by the laser and/or other slag or debris on the surface of the cut.

Then, referring to Block 130, the wafer that has been laser scribed is cleaned, for example by wet etching, to reduce scribe damage to the substrate that was caused by the laser scribing. At least some, and in some embodiments all, of the slag may be removed and at least some, and in some embodiments all, of the amorphous (melted) surface may be removed. After cleaning, the laser scribing cut may have a crystalline surface that is free of slag. Moreover, the wet etching may also preferentially etch along crystal planes of the crystalline surface of the laser scribing cut, so that the surface of the laser scribing cut may be textured along crystal planes of the substrate. Finally, the cleaning may also change the geometry of the laser scribing cut. The crystalline textured surface of the wet etched laser scribing cut and/or the changed geometry thereof may enhance light extraction through the substrate in a completed LED.

Then, referring to Block 140, electrical contact layers for the LED are formed on the wafer that has been wet etched. The contacts may be formed on the LED epitaxial region and/or on the substrate. The contacts generally include one or more metal layers, but also may include transparent conductive layers, such as transparent conductive oxides including indium tin oxide (ITO).

Some embodiments, as described in Blocks 110-140, may arise from recognition that the laser scribing may produce damage in the laser scribing cut, which ultimately forms the sidewalls of the completed LED, and which may adversely impact light extraction from the LED. Cleaning can at least partially cure this damage. Unfortunately, however, cleaning may adversely impact the fragile electrical contacts of the LED. By moving the laser scribing and cleaning to the front end of the fabrication process, prior to forming the contacts, the damage caused by the laser scribing can be at least partially cured without the need to impact the performance and/or reliability of the contacts. Moreover, by moving laser scribing to the front end of the fabrication process, other potential advantages may be obtained. For example, a deeper scribe than is conventional may be provided without increasing the scribe damage. By allowing a deeper scribe, the substrate may need not be thinned unduly to accommodate a shallow scribe. In particular, conventional scribe lines may be about 20 µm deep, but various embodiments described herein can provide scribe lines that are up to 40 µm or more deep.

As described above, some embodiments can reduce or eliminate the need to thin the substrate before laser scribing. By allowing an unthinned substrate to be laser scribed and cleaned, other advantages may be provided according to various embodiments. Specifically, thinned wafers are typically mounted on carrier wafers with tape, wax or other temporary bonding media, which themselves may significantly limit the cleaning options. Moreover, these temporary bonding methods do not typically lend themselves to high temperature processes or aggressive chemical processes.

Thus, in some embodiments, at Block 120, a wafer that comprises an unthinned substrate and an LED epitaxial region thereon, is laser scribed to produce a laser scribing cut. Then, at Block 130, the wafer that has been scribed is cleaned to reduce scribe damage to the unthinned substrate by the laser scribing. Then, at Block 150, the unthinned substrate is thinned or removed. Prior to thinning or removal at Block 150, the wafer may be attached to another permanent or temporary carrier wafer using conventional techniques. The electrical contact layers are formed at Block 140, either prior to or after thinning/removing the substrate at Block 150. In these embodiments, the contacts may be formed at Block 140, either before or after cleaning is performed at Block 130. If the contacts are formed prior to cleaning, a thick passivation layer may be formed over the entire device to protect the contacts. It may desirable for the thick passivation layer to provide a hermetic seal over the contacts. Moreover, further photoprocessing may be needed after the cleaning to open the passivation on the contacts or to remove the passivation layer.

Still referring to FIG. 1, additional back end processing may be performed. For example, the substrate may be thinned or removed at Block 150 if this has not already been done. This thinning or removal may be preceded by attachment to a permanent or temporary carrier substrate. At Block 160, devices or groups of devices are singulated, and at Block 170 the devices are packaged, tested, etc. It will be understood that the operations of Blocks 140, 150, 160 and 170 may be performed out of the order shown in FIG. 1.

Figure 2:
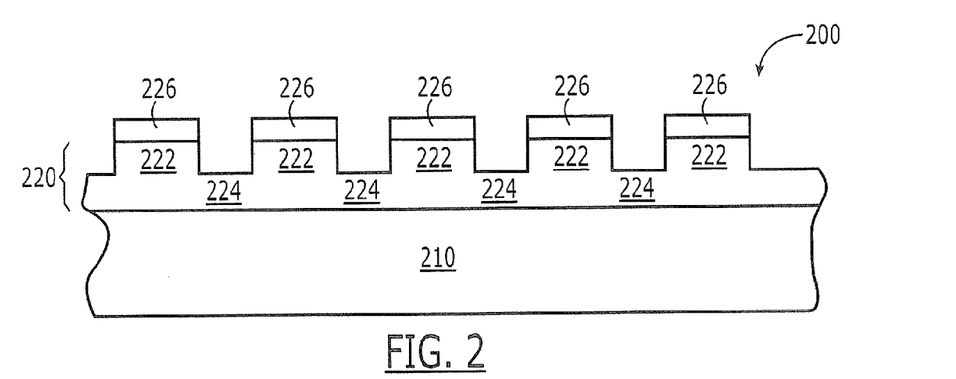
FIGS. 2-4 are cross-sectional views of LEDs according to various embodiments of FIG. 1 during intermediate fabrication according to various embodiments.

FIG. 2 is a cross-sectional view of a wafer including a substrate and an LED epitaxial region thereon, as was described, for example, at Block 110 of FIG. 1. More specifically, referring to FIG. 2, the wafer 200 may include a substrate 210 that comprises, for example, silicon carbide or sapphire, and an LED epitaxial region 220 thereon. The LED epitaxial region 220 may comprise, for example, gallium nitride-based materials and may include a diode region 222 in the form of a mesa or pedestal and other regions 224 that may include quantum wells, buffer layers, etc. In other embodiments, the mesas need not be provided, but, rather, a planar LED epitaxial region 220 may be provided. The LED epitaxial region 220 may be configured to provide a vertical LED and/or a lateral LED. In embodiments of FIG. 2, a mask 226, such as a silicon dioxide mask, may be used to define the mesas 222. This mask 226 also may be used to protect the diode region 222 during a subsequent cleaning according to various embodiments described herein. Alternatively, a mask may be provided later in the processing in other embodiments, or need not be used at all.

From a scale standpoint, the wafer 200 may be up to 4" or more in diameter, and may include an LED epitaxial region 220 for thousands of individual LEDs. The substrate may be several hundred microns thick, and in some embodiments about 400 µm thick. The LED epitaxial region 220 may be several microns thick, and in some embodiments, about 4 µm thick.

Figure 3:
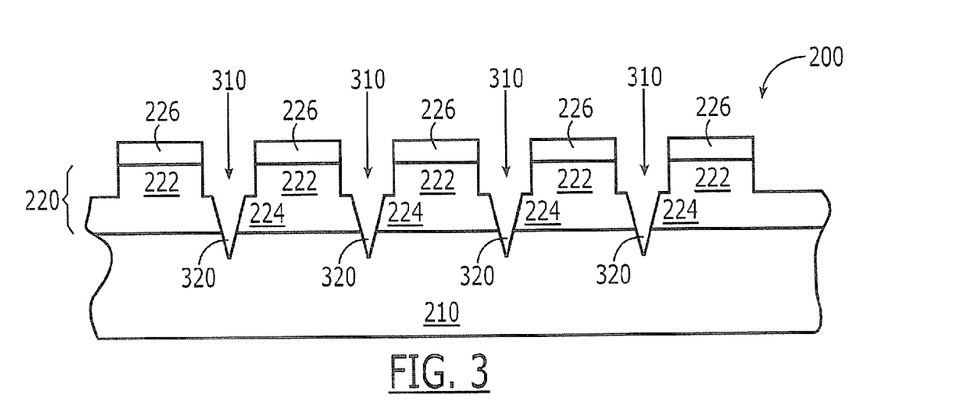

FIG. 3 is a cross sectional view of laser scribing as was described, for example, at Block 120 of FIG. 1. As shown in FIG. 3, the wafer 200 is laser scribed using a laser beam 310 to produce a laser scribing cut 320. In some embodiments, as illustrated in FIG. 3, the laser beam 310 is impinged through the LED epitaxial region 220 and partially into the substrate 310, to produce the laser scribing cut 320. In other embodiments, however, the laser 310 may be impinged through the face of the substrate 210 that is opposite the diode region (the bottom face of FIG. 3), to form a laser cut that extends partially into the substrate 210 from the back side thereof. It will be understood that the laser may be, for example, a UV laser that is scanned across the wafer 200. In other embodiments, multiple beams may simultaneously impinge on the wafer 200. A first pass may be of relatively high power to produce a deep scribe cut. A second pass may be of lower power to remove some of the damage produced by the first pass. Operating parameters of the laser beam 310, including beam shape, wavelength, power, frequency and/or scanning speed, may be set to provide a desired geometry (e.g., depth and/or profile) of the scribing cut 320.

Figure 5A:
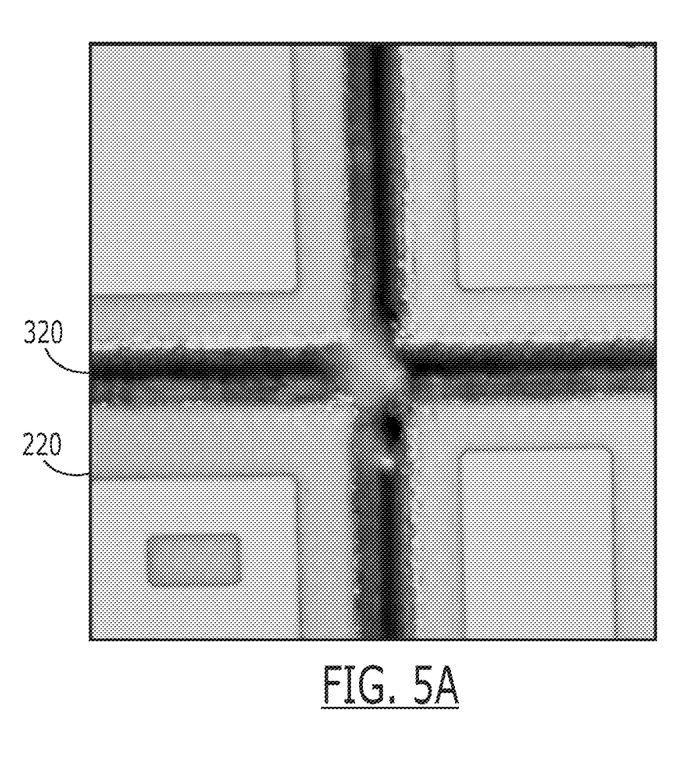
FIG. 5A is a top view of an LED after conventional laser scribing.

The laser scribing may produce damage at the laser scribing cut 320. In particular, the laser beam 310 may cause localized melting at the laser cut surface to convert at least some of the surface from a crystalline state to an amorphous state. Moreover, debris, often referred to as "slag" may be present at the surface of the laser cut 320. For example, FIG. 5A is a Scanning Electron Micrograph (SEM) top view of a portion of a wafer 200 after laser scribing. As can be seen, the laser scribing cut 320 contains scribe damage.

Figure 6A:
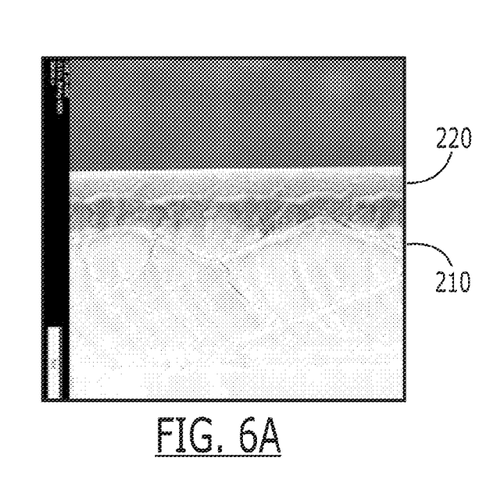
FIG. 6A is a cross-sectional view of an LED after laser scribing with a single pass laser.

FIG. 6A is an SEM illustrating a side view of a diced LED after laser scribing. Damage to the substrate 210 is clearly illustrated. In fact, the damage is so great that the interface between the LED epitaxial region 220 and the substrate 210 is obscured by the damage.

Figure 7A:
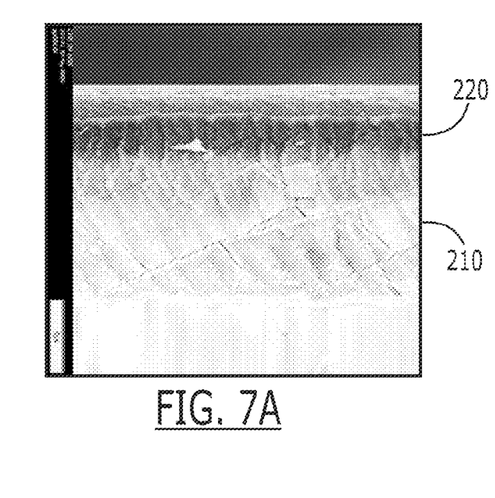
FIG. 7A is a cross-sectional view of an LED after laser scribing with a double pass laser.

FIG. 7A provides another side view of a singulated LED device after a double pass laser scribe. As shown in FIG. 7A, although a double pass laser scribe at differing laser parameters may be desirable in order to provide a desired depth and/or profile of the scribe line 320, even more damage to the substrate 210 is clearly illustrated.

Figure 4:
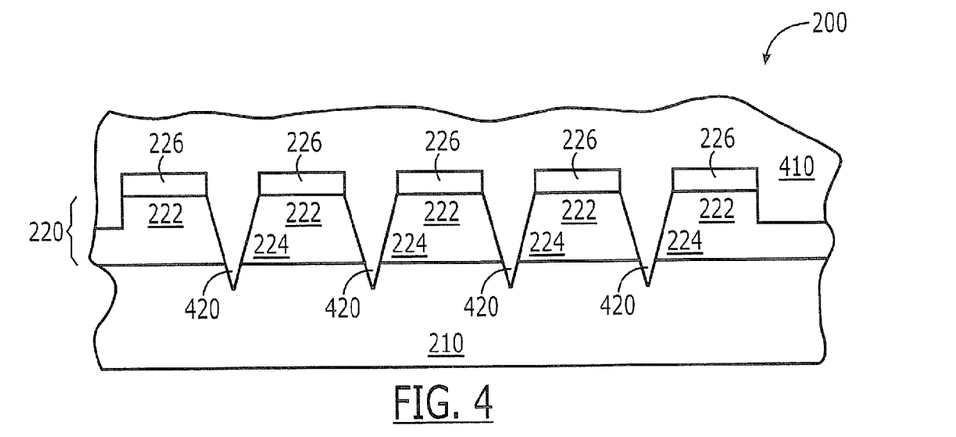

FIG. 4 illustrates cleaning as was described, for example, in connection with Block 130 of FIG. 1, according to various embodiments. As shown in FIG. 4, in some embodiments, the wafer is cleaned by exposure to a wet etching solution 410, for example by dipping and/or coating. The wet etching can reduce or eliminate the scribe damage caused by the laser scribing, to produce a laser scribing cut 420 that has reduced scribe damage. In particular, at least some, and in some embodiments all, of the amorphous (melted) surface of the laser scribing cut 420 may be removed. Also, at least some, and in some embodiments all, of the laser slag or debris may be removed. Moreover, as shown in FIG. 4, the ultimate geometry of the laser cut 420 may also be changed by the wet etching, to provide a desired geometry that can enhance light extraction.

Figure 5B:
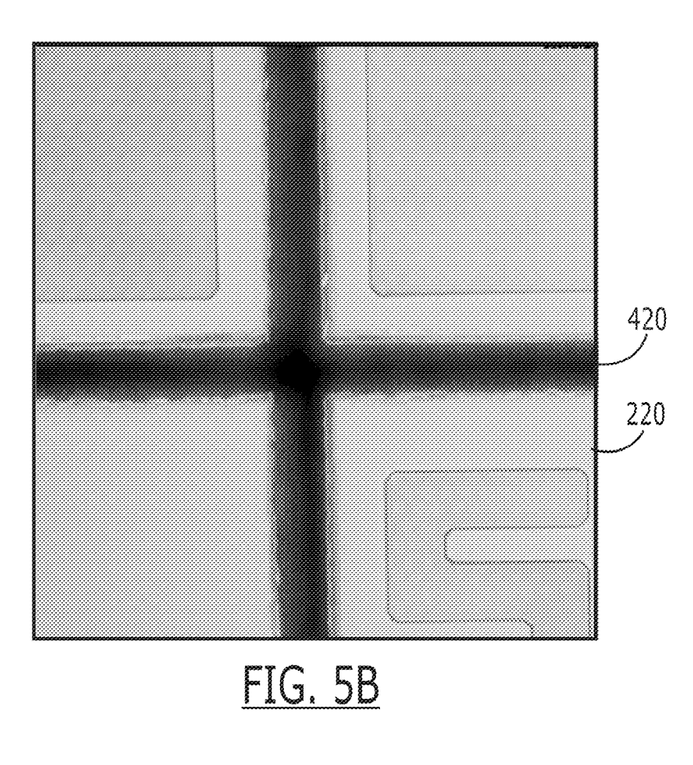
FIG. 5B is a top view of an LED after scribing according to various embodiments.
Figure 6B:
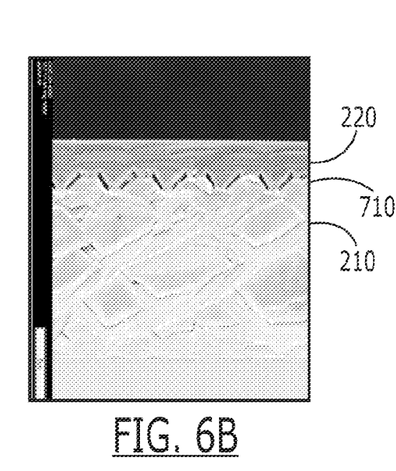
FIG. 6B is a cross-sectional view of an LED after laser scribing with a single pass laser and cleaning according to various embodiments.
Figure 7B:
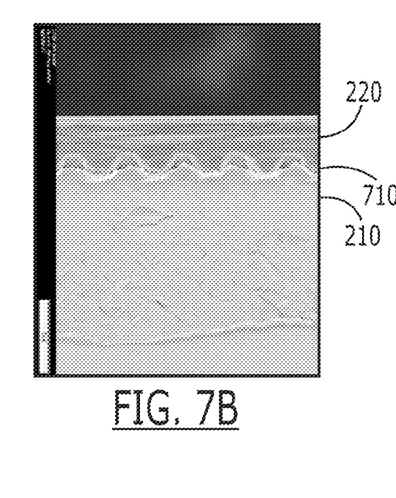
FIG. 7B is a cross-sectional view of an LED after laser scribing with a double pass laser and cleaning according to various embodiments.

FIG. 5B corresponds to FIG. 5A, but after wet etching in a solution of sulfuric and phosphoric acid at about 275° C. for about 10 minutes. As clearly shown, scribe damage is greatly reduced. Similarly, FIG. 6B corresponds to FIG. 6A after a 275° C. sulfuric/phosphoric acid clean. As shown, much of the damage to the substrate 210 is removed to the point where the Patterned Sapphire Substrate (PSS) interface 710 between the substrate 210 and the LED epitaxial region 220 is clearly shown. Similar results are shown in FIG. 7B for a wet etch after a double pass laser scribe.

The acid wet etch of FIG. 4 may also provide other benefits. In particular, in addition to cleaning the laser damage, the acid may etch small features or texturing that extend along crystal planes of the crystallographic substrate. This texturing or faceting is clearly shown in FIGS. 6B and 7B, and can provide improved light extraction for the completed device. In some embodiments, light loss of a single pass laser (FIG. 6A) or a double pass laser (FIG. 7A) may be about 12% compared to light loss from a diamond scribe. In contrast, light loss according to various embodiments shown in FIGS. 6B and 7B may be less than about 1.5% or about an order of magnitude less.

In some embodiments, the wet etch 410 uses an acid-based wet chemistry, such as 3:1 sulfuric:phosphoric acid at elevated temperatures, such as about 275° C., and for times between about 7 minutes and about 11 minutes. However, other wet etch chemistries that can etch gallium nitride-based materials and sapphire or silicon carbide preferentially along certain crystal planes can be used to provide sloped or textured surfaces in addition to the damage removal. Moreover, dry etching and/or other cleaning techniques may be used in other embodiments.

Referring again to FIG. 4, the mask 226 may be used to protect the face of the epitaxial region 220 from the cleaning. If such a mask is desirable, it may be provided by retaining a mask that was used during the LED fabrication, for example a mask 226 that is used to form mesas 222. Alternatively, a separate mask 226 may be formed on the LED epitaxial region 220 either prior to laser scribing or after laser scribing but prior to cleaning. The mask 226 may then be removed if no longer needed.

Figure 8:
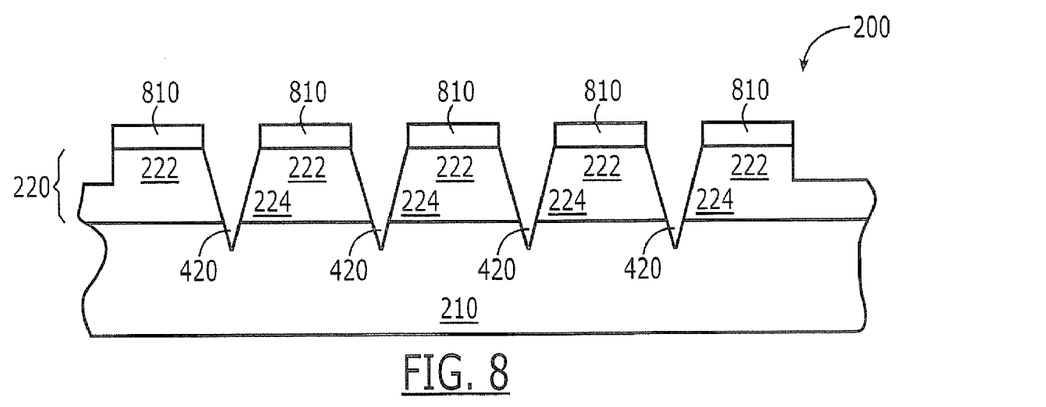
FIGS. 8-9 are cross-sectional views of LEDs according to various other embodiments.

FIG. 8 is a cross-sectional view of electrical contact layers for the LED on the wafer that has been cleaned, as described, for example, in connection with Block 140 of FIG. 1. In particular, the masking layer 226 may be removed if present and electrical contact layers 810 for the LED are formed. Since the wet etch cleaning already has occurred, the wet etch does not impact the formation of the fragile electrical contact layers. Each LED device may include one or more contact layers to the diode region 220. As is well known, the electrical contact layers may include a transparent ohmic contact, such as ITO, a current spreading layer, a reflective ohmic contact, a separate reflective layer, a barrier layer, a bonding layer, a bond pad and/or other layers, and need not be described in detail herein. In some embodiments, anode and cathode contacts may be formed on the same face of the LED epitaxial region 220 or on opposite faces thereof, including directly on the substrate 210.

Figure 9:
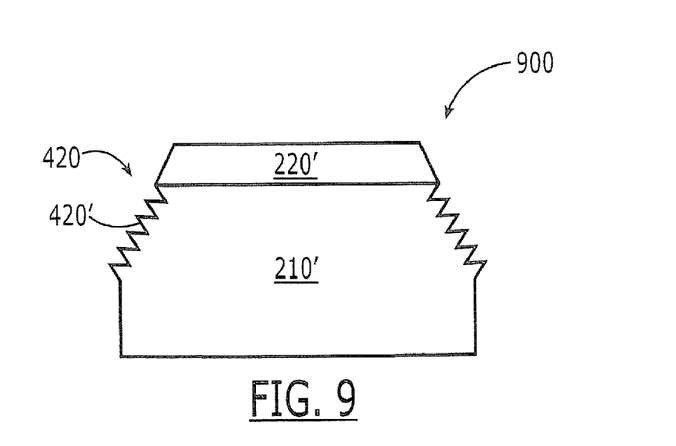

Referring again to FIG. 1, a substrate may be thinned or removed, and the substrate is singulated, as was described, for example, in Blocks 150 and 160 of FIG. 1, to produce a bare LED die such as the bare LED die 900 of FIG. 9. The bare LED die 900 includes a portion 210' of the original wafer substrate 210, a portion 220' of the epitaxial region 220, and a sidewall of the LED that is formed by the cleaned laser scribe 420 of FIG. 8.

As illustrated in FIG. 9, an LED 900 according to various embodiments includes a crystalline substrate 210' and an LED epitaxial region 220' on the crystalline substrate 220'. A sidewall of the epitaxial region 220' and a sidewall of the crystalline substrate 210 adjacent thereto, collectively referred to by 420 in FIG. 9, extend oblique to a face of the LED epitaxial region 220. The oblique sidewall 420 has a crystalline surface. Moreover, the oblique sidewall 420 may also include texturing therein along crystal planes of the crystalline substrate, as indicated by the regular facets 420' in FIG. 9.

Figure 10:
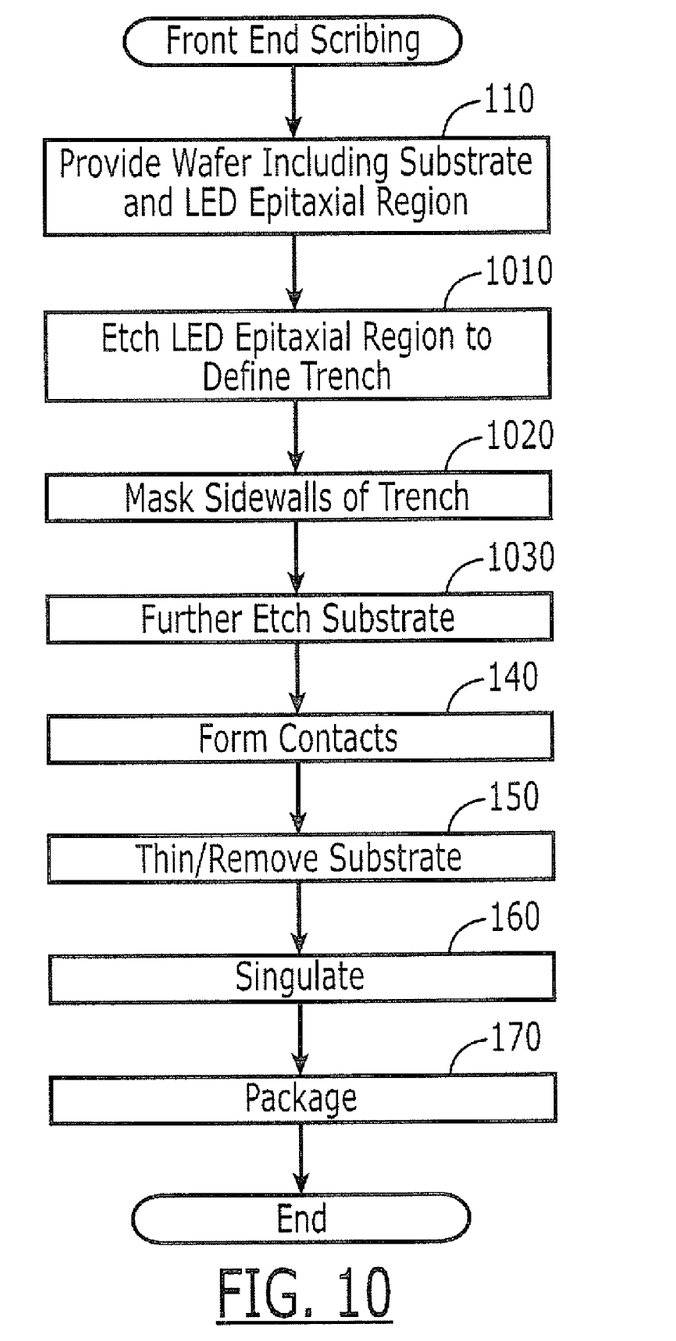
FIG. 10 is a flowchart of operations that may be used to fabricate a light emitting diode according to various other embodiments.

FIG. 10 is a flowchart of operations to provide front end scribing of LEDs according to still other embodiments. Referring to FIG. 10, at Block 110, a wafer including a substrate and an LED epitaxial region may be provided, as was described above in connection with Block 110 of FIG. 1. At Block 1010, the LED epitaxial region is etched to define a trench in the LED epitaxial region that exposes the substrate. Etching may use conventional dry etching. At Block 1020, the sidewalls of the trench are masked while still exposing the substrate. At Block 1030, the substrate that is still exposed by the mask is further etched to produce a scribing cut in the substrate. Wet etching as described in Block 130 of FIG. 1 may be used. Operations to form contacts, thin/remove the substrate, singulate and package as previously described at Blocks 140-170 of FIG. 1, may then be performed.

Embodiments of FIG. 10 can reduce or eliminate the need to use a laser in the scribing. However, relatively long etch times, such as about an hour, may be needed to etch the scribing cut into the substrate. The mask of Block 1020 may be used to protect the LED epitaxial region during the relatively long scribing cut etch of Block 1030.

Figure 11:
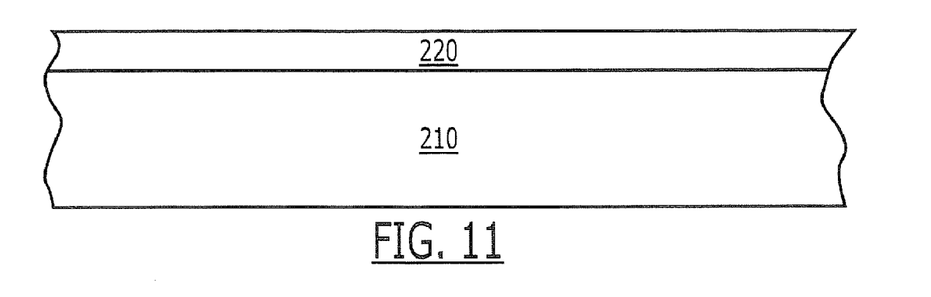
FIGS. 11-14 are cross-sectional views of LEDs according to various embodiments of FIG. 10 during intermediate fabrication according to various embodiments of FIG. 10.

More specifically, FIG. 11 is a cross-sectional view of a wafer 210 including an LED epitaxial region 220 thereon, as was described at Block 110 of FIGS. 1 and 10. In FIG. 11, mesas in the LED epitaxial region 220 are not shown. However, they may be provided in other embodiments.

Figure 12:
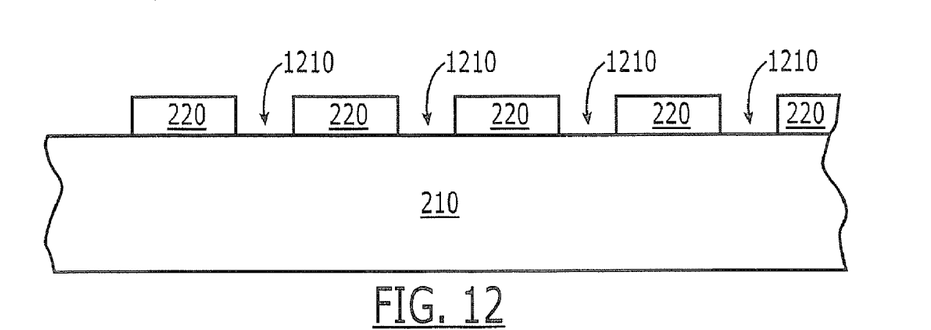

Referring now to FIG. 12, the LED epitaxial region 220 is etched to define a trench 1210 in the LED epitaxial region 220 that exposes the substrate 210, as was described, for example, at Block 1010 of FIG. 10. Conventional dry etching may be used. Moreover, the LED epitaxial region may be protected by a mask as was described in connection with FIG. 2, in some embodiments.

Figure 13:
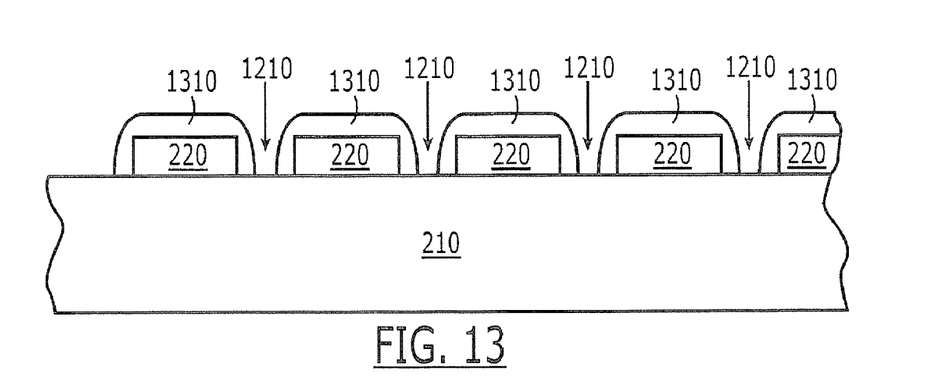

FIG. 13 illustrates forming a mask 1310 on the sidewalls of the trench 1210, while still exposing the substrate 210. The mask may comprise, for example, silicon dioxide and may be formed by blanket forming a conformal layer of silicon dioxide, for example about 1 μm thick, on the structure of FIG. 12 and then anisotropically etching using a conventional photoprocess and a dry or wet etch to remove the $SiO_2$ in the desired area. In some embodiments, as shown in FIG. 13, the mask 1310 also extends on the LED epitaxial region 220 outside the trench 1210, while still exposing the substrate 210.

Figure 14:
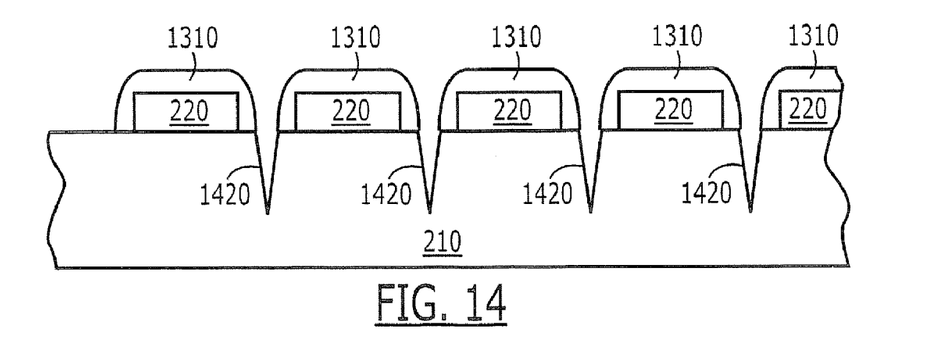

FIG. 14 is a side cross-sectional view of various embodiments after further etching the substrate, as was described, for example, at Block 1030 of FIG. 10. Specifically, the substrate 210 that is still exposed by the mask 1310 is partially etched into, to produce a scribing cut 1420 in the substrate. Since the scribing cut 1420 is formed by etching, it may contain the desirable features described above, such as crystalline sidewalls with texturing extending along crystal planes thereof and with little or no debris thereon.

Contact formation, substrate thinning/removal, singulation and packaging may then proceed as was described in connection with Blocks 140-170 of FIG. 1.

Additional discussion of various embodiments will now be provided. In particular, scribing LED wafers for singulation is generally performed once the wafers have completed device fabrication and have been thinned to a final thickness. Lasers have been replacing diamond scribing to provide many potential advantages and/or cost savings. However, there is often a radiant flux penalty due to the residual damage in the substrate. Some very sophisticated laser systems have been developed in an attempt to reduce or minimize this impact, but these lasers may be very expensive in terms of capital expense and/or cost of ownership.

Various embodiments described herein can provide the scribing at the front end of the fabrication process, where the wafers can be full thickness and the devices are not fully fabricated. At this point in the process, there may be no contact metals, conductive oxides, etc., that could prevent the use of etching to provide scribing or provide damage removal from laser scribing.

Accordingly, laser scribing at the front end can allow for clean up of at least some of the damage, to thereby reduce or minimize light loss. Moreover, dicing of the wafer while it is still thick may also provide other advantages. In particular, after final thinning, the wafers only need to go through a break process, which limits the process steps that are normally performed to scribe the thinned wafer. Also, since the laser damage can be cleaned up, a deeper scribe can be used without increasing the radiant flux loss. Typically, the scribe depth that is used is a function of the final device thickness. Sapphire device wafers are typically made very thin (for example, less than about 90 μm), to accommodate shallow scribes by conventional diamond or laser scribing, so as to reduce or minimize the damaged area. A deeper scribe according to various embodiments described herein can allow the final thickness of the device wafer to remain thicker than the standard, which can improve process yield.

Various embodiments described in connection with FIGS. 1-9 use a laser scribe and break process for singulation, combined with a post-scribe damage removal process, to allow significant reduction or elimination of radiant flux loss. Light loss associated with conventional laser scribing and breaking that is performed at the end of the fabrication process is well known. Unfortunately, once devices are in their final form, there may be significant limitations on the employment of any post-laser scribe cleaning, since the devices are fully fabricated with metal contacts, etc., and substrates are typically thinned to about 100 μm or less.

In some embodiments of FIGS. 1-9, the laser scribe may be performed from the diode side the device, either prior to or post-mesa etch. A laser is used to scribe through the gallium nitride-based epitaxial region in the dicing streets and into the substrate to a depth of, in some embodiments, between about 10 μm to about 40 μm. The resulting laser damage and slag is then removed, for example by acid-based wet chemistries at elevated temperatures. Chemistries known to etch gallium nitride and sapphire preferentially along certain planes can also be used to provide sloped or textured surfaces in addition to the damage removal. Thus, light extraction may also be enhanced by tailoring the sidewall angles with the laser conditions and/or using chemistries that etch the gallium nitride and/or substrate preferentially along crystal planes to provide sloped and/or textured sidewalls.

In embodiments described in FIGS. 11-14, the LED epitaxial region may be removed from the dicing streets via an etch process, and then the substrate can be chemically etched to provide the scribe. For example, a conventional dry etch for gallium nitride-based materials may be used to remove the gallium nitride from the dicing streets to expose the substrate. The substrate may then be etched chemically to provide the scribe. The gallium nitride sidewall generally should be protected, since the substrate etch time may be relatively long, and the acid chemistry may etch the gallium nitride along the crystal planes in the lateral direction.

In any of the embodiments described above, the active LED epitaxial region may be protected by an appropriate dielectric, such as silicon dioxide, to reduce adverse impact. Final thinning of the substrate may be performed with the wafer mounted on a temporary wafer (carrier). The wafer may then be debonded and is ready for the break process to singulate the individual devices. In other embodiments, a permanent carrier wafer may be used.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a plurality of Light Emitting Diodes (LEDs) comprising:
   laser scribing a wafer that comprises a substrate and an LED epitaxial region thereon to produce a laser scribing cut;
   after said laser scribing, cleaning the wafer that has been laser scribed to reduce scribe damage to the substrate by the laser scribing;
   after said cleaning, forming electrical contact layers for the LEDs on the wafer that has been cleaned; and
   after said forming the electrical contact layers, singulating the wafer to produce the plurality of LEDs.

2. A method according to claim 1 wherein laser scribing comprises impinging a laser beam through the LED epitaxial region and partially into the substrate to produce the laser scribing cut and wherein cleaning comprises wet etching the wafer through the LED epitaxial region that has been laser scribed and into the substrate that has been laser scribed to reduce the scribe damage to the substrate by the laser scribing.

3. A method according to claim 1 wherein the substrate is a crystalline substrate, wherein the laser scribing creates a laser scribing cut in the substrate having an amorphous surface and wherein the cleaning removes at least some of the amorphous surface to expose at least some of the crystalline substrate at the laser scribing cut.

4. A method according to claim 3 wherein the cleaning changes a geometry of laser scribing cut in the substrate.

5. A method according to claim 1 wherein cleaning the wafer is followed by thinning the substrate.

6. A method according to claim 1 wherein the LED epitaxial region comprises gallium nitride-based materials and wherein the substrate comprises silicon carbide or sapphire.

7. A method according to claim 1 wherein cleaning is performed using a wet etching solution above room temperature.

8. A method according to claim 1 wherein cleaning is performed using a sulfuric and phosphoric acid solution at about 275° C.

9. A method according to claim 1 wherein cleaning is preceded by masking at least some of the LED epitaxial region that is outside the laser scribing cut.

10. A method according to claim 1 wherein laser scribing is preceded by masking at least some of the LED epitaxial region that is outside an area to be laser scribed.

11. A method according to claim 1 wherein laser scribing is performed at least twice under different laser parameters.

12. A method of fabricating a plurality of Light Emitting Diodes (LEDs) comprising:
    laser scribing a wafer that comprises an unthinned substrate and an LED epitaxial region thereon to produce a laser scribing cut;
    after said laser scribing, cleaning the wafer that has been laser scribed to reduce scribe damage to the unthinned substrate by the laser scribing;
    after said cleaning thinning the unthinned substrate of the wafer; and
    after said thinning singulating the wafer to produce the plurality of LEDs,
    wherein the cleaning is followed by forming electrical contact layers for the LEDs on the wafer that has been cleaned.

13. A method according to claim 12 wherein laser scribing comprises impinging a laser beam through the LED epitaxial region and partially into the unthinned substrate to produce the laser scribing cut and wherein cleaning comprises wet etching the wafer through the LED epitaxial region that that has been laser scribed and into the unthinned substrate that has been laser scribed to reduce the scribe damage to the substrate by the laser scribing.

14. A method according to claim 12 wherein the unthinned substrate is a crystalline unthinned substrate, wherein the laser scribing creates a laser scribing cut in the unthinned substrate having an amorphous surface and wherein the cleaning removes at least some of the amorphous surface to expose at least some of the crystalline substrate at the laser scribing cut.

15. A method according to claim 14 wherein the cleaning changes a geometry of laser scribing cut in the unthinned substrate.

16. A method according to claim 12 wherein laser scribing is performed at least twice under different laser parameters.

* * * * *

UNITED STATES PATENT AND TRADEMARK OFFICE
CERTIFICATE OF CORRECTION

PATENT NO. : 8,216,867 B2
APPLICATION NO. : 12/482165
DATED : July 10, 2012
INVENTOR(S) : Donofrio et al.

Page 1 of 1

It is certified that error appears in the above-identified patent and that said Letters Patent is hereby corrected as shown below:

On the Title Page:
Item [56] Line 1:
  Please correct "6,489,524 B1 12/2002 Shelton et al."
  to read -- 6,849,524 B2 2/2005 Shelton et al. --

In the Claims:
Column 12, Claim 12, Line 28: Please correct "said cleaning thinning the unthinned"
  by adding a "," after "cleaning" so that it reads
  -- said cleaning, thinning the unthinned --

Signed and Sealed this
Fourth Day of June, 2013

Teresa Stanek Rea
*Acting Director of the United States Patent and Trademark Office*